(12) United States Patent
Stevens et al.

(10) Patent No.: US 7,851,059 B2
(45) Date of Patent: Dec. 14, 2010

(54) NANO AND MESO SHELL-CORE CONTROL OF PHYSICAL PROPERTIES AND PERFORMANCE OF ELECTRICALLY INSULATING COMPOSITES

(75) Inventors: Gary Stevens, Surry (GB); James D. B. Smith, Monroeville, PA (US); John W. Wood, Winter Springs, FL (US)

(73) Assignee: Siemens Energy, Inc., Orlando, FL (US)

( * ) Notice: Subject to any disclaimer, the term of this patent is extended or adjusted under 35 U.S.C. 154(b) by 1112 days.

(21) Appl. No.: 11/529,453

(22) Filed: Sep. 28, 2006

(65) Prior Publication Data

US 2010/0239851 A1 Sep. 23, 2010

Related U.S. Application Data

(63) Continuation-in-part of application No. 11/152,983, filed on Jun. 14, 2005, now abandoned.

(51) Int. Cl.
B32B 5/16 (2006.01)
B32B 27/38 (2006.01)
B32B 29/00 (2006.01)

(52) U.S. Cl. .............. 428/323; 428/324; 428/328; 428/329; 428/330; 428/331; 428/413; 428/537.5

(58) Field of Classification Search ................ None
See application file for complete search history.

(56) References Cited

U.S. PATENT DOCUMENTS

| | | |
|---|---|---|
| 3,246,271 A | 4/1966 | Ford |
| 3,866,316 A | 2/1975 | Takechi et al. |
| 3,974,302 A | 8/1976 | Croop et al. |
| 4,001,616 A | 1/1977 | Lonseth et al. |
| 4,160,926 A | 7/1979 | Cope et al. |
| 4,335,367 A | 6/1982 | Mitsui et al. |
| 4,361,661 A | 11/1982 | Jackson |
| 4,400,226 A | 8/1983 | Horrigan |
| 4,427,740 A | 1/1984 | Stackhouse et al. |
| 4,491,618 A | 1/1985 | Kuwajima et al. |
| 4,634,911 A | 1/1987 | Studniarz et al. |
| 4,694,064 A | 9/1987 | Tomalia et al. |
| 4,704,322 A | 11/1987 | Roberts |
| 4,760,296 A | 7/1988 | Johnston et al. |
| 4,806,806 A | 2/1989 | Hjortsberg et al. |
| 5,011,872 A | 4/1991 | Latham et al. |
| 5,037,876 A | 8/1991 | Birkle et al. |
| 5,126,192 A | 6/1992 | Chellis et al. |
| 5,281,388 A | 1/1994 | Palmer et al. |
| 5,409,968 A | 4/1995 | Clatanoff et al. |
| 5,466,431 A | 11/1995 | Dorfman et al. |
| 5,510,174 A | 4/1996 | Litman |
| 5,540,969 A | 7/1996 | Schuler |
| 5,578,901 A | 11/1996 | Blanchet-Fincher et al. |
| 5,688,382 A | 11/1997 | Besen et al. |
| 5,723,920 A | 3/1998 | Markovitz et al. |
| 5,780,119 A | 7/1998 | Dearnaley et al. |
| 5,801,334 A | 9/1998 | Theodorides |
| 5,878,620 A | 3/1999 | Gilbert et al. |
| 5,904,984 A | 5/1999 | Smith et al. |
| 5,938,934 A | 8/1999 | Balogh et al. |
| 5,982,056 A | 11/1999 | Koyama et al. |
| 6,015,597 A | 1/2000 | David |
| 6,048,919 A | 4/2000 | McCullough |
| 6,103,382 A | 8/2000 | Smith et al. |
| 6,130,495 A | 10/2000 | Schulten et al. |
| 6,130,496 A | 10/2000 | Takigawa et al. |
| 6,140,590 A | 10/2000 | Baumann et al. |
| 6,160,042 A | 12/2000 | Ishida |
| 6,190,775 B1 | 2/2001 | Smith et al. |
| 6,238,790 B1 | 5/2001 | Smith et al. |
| 6,251,978 B1 | 6/2001 | McCullough |
| 6,255,738 B1 | 7/2001 | Distenfano |
| 6,261,424 B1 | 7/2001 | Goncharenko et al. |

(Continued)

FOREIGN PATENT DOCUMENTS

DE 4244298 6/1994

(Continued)

OTHER PUBLICATIONS

Von Roll Isola, "Mica Tapes," product literature, 381.58, date unknown.

(Continued)

*Primary Examiner*—Sheeba Ahmed

(57) ABSTRACT

A high thermal conductivity resin that is made up of a host resin matrix (42) and high thermal conductivity fillers (30) that are mixed within the host resin to form a resin mixture. The fillers comprise at least 3-5% by weight of the resin mixture, and the fillers are from an average of 1-100 nm in at least one dimension, and where the particles are smaller than an average of 1000 nm in the particles' longest dimension. The host resin matrix forms an ordered resin shell (40) around the high thermal conductivity fillers (30), whereby resin molecules are aligned perpendicular to the surface of the high thermal conductivity fillers. An overlap of the ordered resin shells (44) is formed between the high thermal conductivity fillers such that continuous pathways for ordered resin shells are created through the resin mixture.

19 Claims, 6 Drawing Sheets

U.S. PATENT DOCUMENTS

| | | |
|---|---|---|
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,344,271 B1 | 2/2002 | Yadav et al. |
| 6,359,232 B1 | 3/2002 | Markovitz et al. |
| 6,393,642 B1 | 5/2002 | Pollman |
| 6,396,864 B1 | 5/2002 | O'Brien et al. |
| 6,426,578 B1 | 7/2002 | Mori et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,510,059 B2 | 1/2003 | Mitani et al. |
| 6,548,172 B2 | 4/2003 | David et al. |
| 6,572,937 B2 | 6/2003 | Hakovirta et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 | 4/2006 | Smith |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,425,366 B2 | 9/2008 | Okamoto et al. |
| 7,547,847 B2 | 6/2009 | Miller |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2002/0146562 A1 | 10/2002 | Morita et al. |
| 2003/0035960 A1 | 2/2003 | Tsunoda et al. |
| 2003/0040563 A1 | 2/2003 | Sagal et al. |
| 2003/0139510 A1 | 7/2003 | Sagal et al. |
| 2004/0094325 A1 | 5/2004 | Yoshida et al. |
| 2004/0102597 A1 | 5/2004 | Tobita et al. |
| 2004/0122153 A1 | 6/2004 | Guo et al. |
| 2004/0152829 A1 | 8/2004 | Tobita et al. |
| 2004/0241439 A1 | 12/2004 | Morita et al. |
| 2005/0097726 A1 | 5/2005 | Yamamoto et al. |
| 2005/0116336 A1 | 6/2005 | Chopra et al. |
| 2005/0161210 A1 | 6/2005 | Zhong et al. |
| 2005/0208301 A1 | 9/2005 | Okamoto et al. |
| 2005/0236606 A1 | 10/2005 | Toas et al. |
| 2005/0245644 A1 | 11/2005 | Smith et al. |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2007/0222307 A1 | 9/2007 | Sawa et al. |
| 2008/0050580 A1 | 2/2008 | Stevens et al. |
| 2008/0066942 A1 | 3/2008 | Miller |
| 2008/0262128 A1 | 10/2008 | Stevens et al. |
| 2009/0238959 A1 | 9/2009 | Smith et al. |

FOREIGN PATENT DOCUMENTS

| | | |
|---|---|---|
| EP | 0 157 936 A1 | 10/1985 |
| EP | 0 266 602 A1 | 5/1988 |
| EP | 0 394 767 A2 | 10/1990 |
| EP | 0 604 804 A2 | 7/1994 |
| EP | 1 220 240 A1 | 7/2002 |
| EP | 1 300 439 A1 | 4/2003 |
| EP | 1 383 226 A1 | 1/2004 |
| EP | 1 384 567 A1 | 1/2004 |
| EP | 1 486 997 A1 | 12/2004 |
| EP | 1 530 223 A1 | 5/2005 |
| GB | 881036 A2 | 11/1961 |
| JP | 56029305 | 3/1981 |
| JP | 03205443 A | 9/1991 |
| JP | 06076624 | 3/1994 |
| JP | 06313267 A | 11/1994 |
| JP | 08-020673 | 1/1996 |
| JP | 10-088201 | 4/1998 |
| JP | 10-211659 | 8/1998 |
| JP | 2002212422 A | 7/2002 |
| JP | 2002322243 A | 11/2002 |
| JP | 200506389 A | 1/2005 |
| JP | 2005-199562 A | 7/2005 |
| WO | WO 95/02504 A1 | 1/1995 |
| WO | WO 96/28073 A1 | 9/1996 |
| WO | WO 98/41993 A1 | 9/1998 |
| WO | WO 99/26286 | 5/1999 |
| WO | WO 00/56127 A1 | 9/2000 |
| WO | WO 01/68749 A1 | 9/2001 |
| WO | WO 01/84659 A1 | 11/2001 |
| WO | WO 03/040445 A1 | 5/2003 |
| WO | WO 2004/006271 A1 | 1/2004 |
| WO | WO 2004/052999 A2 | 6/2004 |
| WO | WO 2004/067606 A1 | 8/2004 |
| WO | WO 2005/069312 | 7/2005 |
| WO | WO 2005/106089 A2 | 11/2005 |
| WO | WO 2005/123825 A2 | 12/2005 |
| WO | WO 2005/124790 A2 | 12/2005 |
| WO | WO 2006/002014 A1 | 1/2006 |
| WO | WO 2006/007385 A1 | 1/2006 |

OTHER PUBLICATIONS

Tomoyuki Matsumura, "Phase Structures and Thermal and Conductive properties of Epoxy-Alumina Hybrids Filled with Conductive Fillers," STN database No. 2002:257918, Apr. 8, 2007.

Yasufumi Shibata, "Lipophilic Inorgantic-Organic Hybrid Materials with Low Frictional Coefficient," STN database No. 2002:568167, Jul. 3, 2002, pp. 1-3.

Tari et al., "Impacts on Turbine Generator Design by the Application of Increased Thermal Conducting Stator Insulation" Cigre SC11-01 Meeting, Paper No. 132 (2002).

Sun et al., "Fundamental Research on Surface Modification of Nano-sized Silica for Underfill Applications" 2004 Electronic Components and Technology Conference (2004).

Brutsch et al., "New High Voltage Insulation with Increased Thermal Conductivity" Electrical Electronics Insulation Conference 1993 Proceedings, (Oct. 1993).

Tan et al., "A High Voltage System with Increased Thermal Conductivity for Turbo Generators" Coil Winding, Insulation and Electrical Manufacturing Conference (2001).

Derwent Acc-No. 1980-39239C (JP 55053802 A Derwent Abstract) (Nippon Mica Seisaku).

Product Data Sheet for Polar Therm Boron Nitride Powder Grades PT120, PT140, PT160, and PT 180, provided by Momentive Performance Materials (2007).

POSS® Enhanced Thermosets, Product Brochure from Hybrid Products, Inc., date unknown.

Production Information Sheet for D.E.R.™ 330 (Liquid Epoxy Resin) from The Dow Chemical Co., date unknown.

NANO AND MESO SHELL-CORE CONTROL OF PHYSICAL PROPERTIES AND PERFORMANCE OF ELECTRICALLY INSULATING COMPOSITES

CROSS-REFERENCE TO RELATED APPLICATIONS

This application is a continuation-in-part of U.S. application Ser. No. 11/152,983, "High Thermal Conductivity Materials Incorporated into Resins" filed Jun. 14, 2005 now abandoned, by Smith, et al., which is incorporated herein by reference.

FIELD OF THE INVENTION

The field of the invention relates to the fillers within a host resin matrix and their interaction therewith.

BACKGROUND

With the use of any form of electrical appliance, there is a need to electrically insulate conductors. With the push to continuously reduce the size and to streamline all electrical and electronic systems there is a corresponding need to find better and more compact insulators and insulation systems.

Various epoxy resin materials have been used extensively in electrical insulation systems due to their practical benefit of being tough and flexible electrical insulation materials that can be easily adhered to surfaces. Traditional electrical insulation materials, such as mica flake and glass fiber, can be surface coated and bonded with these epoxy resins, to produce composite materials with increased mechanical strength, chemical resistance and electrical insulating properties. In many cases epoxy resins have replaced traditional varnishes despite such materials having continued use in some high voltage electrical equipment.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene glycol terephthalate mat, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example, glass fiber, may be applied to the coil.

Generally, multiple layers of the mica tape 16 are wrapped about the coil with sixteen or more layers generally being used for high voltage coils. Resins are then impregnated into the tape layers. Resins can even be used as insulation independently from the insulating tape. Unfortunately this amount of insulation only further adds to the complications of dissipating heat. What is needed is electrical insulation that can conduct heat higher than that of conventional methods, but that does not compromise the electrical insulation and other performance factors including mechanical and thermal capability.

Other difficulties with the prior art also exist, some of which will be apparent upon further reading.

SUMMARY OF THE INVENTION

With the foregoing in mind, methods and apparatuses consistent with the present invention, which inter alia facilitates the transport of phonons through a high thermal conductivity (HTC) impregnated medium to reduce the mean distances between the HTC materials below that of the mean phonon path length. This reduces the phonon scattering and produces a greater net flow or flux of phonons away from the heat source. In addition the HTC materials impart a degree of ordering on the surrounding resin structure. This creates an ordered resin shell (ORS) around the HTC materials. The ORSs created in this manner can be manipulated through HTC concentration and clustering to create overlapping areas of ORSs that reduce the scattering of phonons passing through them. The resins may be part of a host matrix medium, such as a multi-layered insulating tape.

High Thermal Conductivity (HTC) organic-inorganic hybrid materials may be formed from discrete two-phase organic-inorganic composites, from organic-inorganic continuous phase materials based on molecular alloys and from discrete organic-dendrimer composites in which the organic-inorganic interface is non-discrete within the dendrimer core-shell structure. Continuous phase material structures may be formed which enhance phonon transport and reduce phonon scattering by ensuring the length scales of the structural elements are shorter than or commensurate with the phonon distribution responsible for thermal transport, and/or that the number of phonon scattering centers are reduced such as by enhancing the overall structural order of the matrix, and/or by the effective elimination or reduction of interface phonon scattering within the composite. Continuous organic-inorganic hybrids may be formed by incorporating inorganic, organic or organic-inorganic hybrid nano-particles in linear or cross-linked polymers (including thermoplastics) and thermosetting resins in which nano-particles dimensions are of the order of or less than the polymer or network segmental length (typically 1 to 50 nm or greater). These various types of nano-particles will contain reactive surfaces to form intimate covalently bonded hybrid organic-inorganic homogeneous materials. Similar requirements exist for inorganic-organic dendrimers which may be reacted together or with matrix polymers or reactive resins to form a continuous material. In the case of both discrete and non-discrete organic-inorganic hybrids it is possible to use sol-gel chemistry to form a continuous molecular alloy. The resulting materials will exhibit higher thermal conductivity than conventional electrically insulating materials and may be used as bonding resins in conventional mica-glass tape constructions, when utilized as unreacted vacuum-pressure impregnation resins and as stand alone materials to fulfill electrical insulation applications in rotating and static electrical power plant and in both high (approximately over 5 kV) and low voltage (approximately under 5 kV) electrical equipment, components and products.

The formation of engineered electrical insulation materials having prescribed physical properties and performance characteristics, and based on the use of nano-to-micro sized inorganic fillers in the presence of organic host materials, requires the production of particle surfaces which can form an intimate interface with the organic host. This may be achieved through the grafting of chemical groups onto the surface of the fillers to make the surface chemically and physically compatible with the host matrix, or the surfaces may contain chemically reactive functional groups that react with the organic host to form covalent bonds between the particle and the host. The use of nano-to-micro sized inorganic fillers in the presence of organic host materials requires the production of particles with defined surface chemistry in addition to bulk dielectric and electrical properties and thermal conductivity. Most inorganic materials do not allow independent selection of structural characteristics such as shape and size and properties to suit different electrical insulation applications or to achieve composites having the right balance of properties and performance. This may be achieved by selecting particles with appropriate bulk properties and shape and size characteristics and then modifying the surface and interfacial properties and other characteristics to achieve the additional control of composite properties and performance required for electrical insulation applications. This may be achieved by appropriate surface coating of the particles which may include the production of metallic and non-metallic inorganic oxides, nitrides, carbides and mixed systems and organic coatings including reactive surface groups capable of reacting with appropriate organic matrices which act as the host material in the electrical insulation system. The resulting hybrid materials and composites in unreacted or partially reacted form may be used as bonding resins in mica-glass tape constructions, as unreacted vacuum-pressure impregnation resins for conventional mica tape constructions, in other glass fiber, carbon fiber and ply-type and textile composites and as stand alone materials to fulfill electrical insulation applications in rotating and static electrical power plant and in both high and low voltage electrical equipment, components and products.

These and other objects, features, and advantages in accordance with the present invention are provided particular embodiments by a high thermal conductivity resin that comprises a host resin matrix and high thermal conductivity fillers that are mixed within the host resin to form a resin mixture. The fillers comprise at least 3-5% by weight of the resin mixture, and the fillers are from an average of 1-100 nm in at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture.

In particular embodiments the fillers have been surface treated to increase reactivity with the resin matrix. The surface treatment is chosen from the group consisting of hydroxyl, carboxylic, amine, epoxide, silane and vinyl. The fillers may also form into dendritic stars.

In other particular embodiments, the ordered resin shell comprises a volume approximately equal to or greater than that of the HTC filler, and the ordered resin shell is formed around individual particles. The fillers are comprised of larger particles and smaller particles, the larger particles have at least one size dimension that is greater than 100 nm and the smaller particles have at least one size dimension that is smaller than 100 nm. In particular the ratio of larger particles to smaller particles will be higher, from 3:1 to 10:1 by weight.

In still other embodiments the resin is comprised of at least 50% liquid crystal epoxy resin. The fillers can provide seeding site for the crystallization of the liquid crystal epoxy resin. The particles may also be surface treated to provide enhanced charge transport, and can have the addition of functional groups chosen from the group comprising OH, COOH, NH2 and SO3H.

In various other embodiments, the resin mixture is impregnated into a porous media. The high thermal conductivity fillers have an aspect ratio of between 10-50. And, the high thermal conductivity filler is formed from a two phase organic-inorganic composite.

In another embodiment the present invention provides for a continuous organic-inorganic resin that comprises a host resin network, and inorganic high thermal conductivity fillers evenly dispersed in, and essentially completely co-reacted with, the host resin network. The high thermal conductivity fillers are selected from at least one of oxides, nitrides, and carbides, and have been surface treated to introduce surface functional groups that allows for the essentially complete co-reactivity with the host resin network. The continuous organic-inorganic resin comprises a minimum of 3% and a maximum of 50% by weight of the high thermal conductivity fillers. The high thermal conductivity fillers are from an average of 1-100 nm in at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture.

In particular embodiments, the oxides, nitrides, and carbides comprise Al2O3, AlN, MgO, ZnO, BeO, BN, Si3N4, SiC and SiO2 with mixed stoichiometric and non-stoichiometric combinations. The continuous organic-inorganic resin is impregnated into a porous media, and the porous media is a paper matrix In still another embodiment the present invention provides for a porous media impregnated with a high thermal conductivity resin that comprises a porous media, and a high thermal conductivity material loaded resin. The high thermal conductivity material comprises 3-50% by weight of the resin, and is one of silica, alumina, magnesium oxide, silicon carbide, boron nitride, aluminum nitride, zinc oxide and diamonds and dendrimers. The high thermal conductivity fillers are from an average of 1-100 nm at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture. An example of a paper matrix is a mica-glass insulating paper or tape.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

The present invention provides for a high thermal conductivity (HTC) composite. HTC composites comprise a resinous host network combined with nano, meso and micro fillers that are two phase organic-inorganic hybrid materials. The organic-inorganic hybrid materials are formed from two phase organic-inorganic composites, from organic-inorganic continuous phase materials that are based on molecular alloys, and from discrete organic-dendrimer composites in which the organic-inorganic interface is non-discrete with the dendrimer core-shell structure. Phonon transport is enhanced and phonon scattering is reduced by not only the distribution of the HTC fillers, but also the ordered resin shell (ORS) created around the HTC fillers. In particular, various embodiments can be used to form overlapping ordered resin shells.

Engineered electrically conducting and insulating composite materials having prescribed physical properties and performance characteristics may be formulated with both micro and macro sized filler systems in a variety of organic host resins. The interface between the particle and the resin, be it inorganic or metallic, is used to enhance physical properties and performance.

This is recognized in particulate filled insulating materials and fillers are selected whose surface chemistry is compatible with the host resin or coupling agents can be used such as silanes and related compounds to achieve improved surface wetting and adhesion of microfillers by the host matrix. In cases where reactive matrix resins are present, the use of reactive coupling agents may also confer benefit, such as helping to achieve good thermal conductivity and mechanical properties in addition to good electrical characteristics and voltage endurance performance. Some examples of reactive matrix resins include silane, silanol, methylsilane, vinylsilane, aminosilane, alkoxysilane and epoxysilane.

The volume occupied by the structured interface of resin around the particle is of the order of or larger than the volume occupied by the filler particle. This applies to filler particles in the size range of approximately 1-100 nm in diameter, or width for particles with high aspect ratios. Larger particles will also order resin around themselves, but the total volume of ordered resin will tend to be less than the volume of the particle. In dealing in the nano and meso scale, these ORSs are therefore large relative to the particle dimensions, and may overlap with one another, or with clusters of fillers that create a mass ORS. This provides the possibility to achieve long stretches of ORS connectivity and controlled percolation structures which can be used to control bulk properties in insulating composites.

Figure 1:
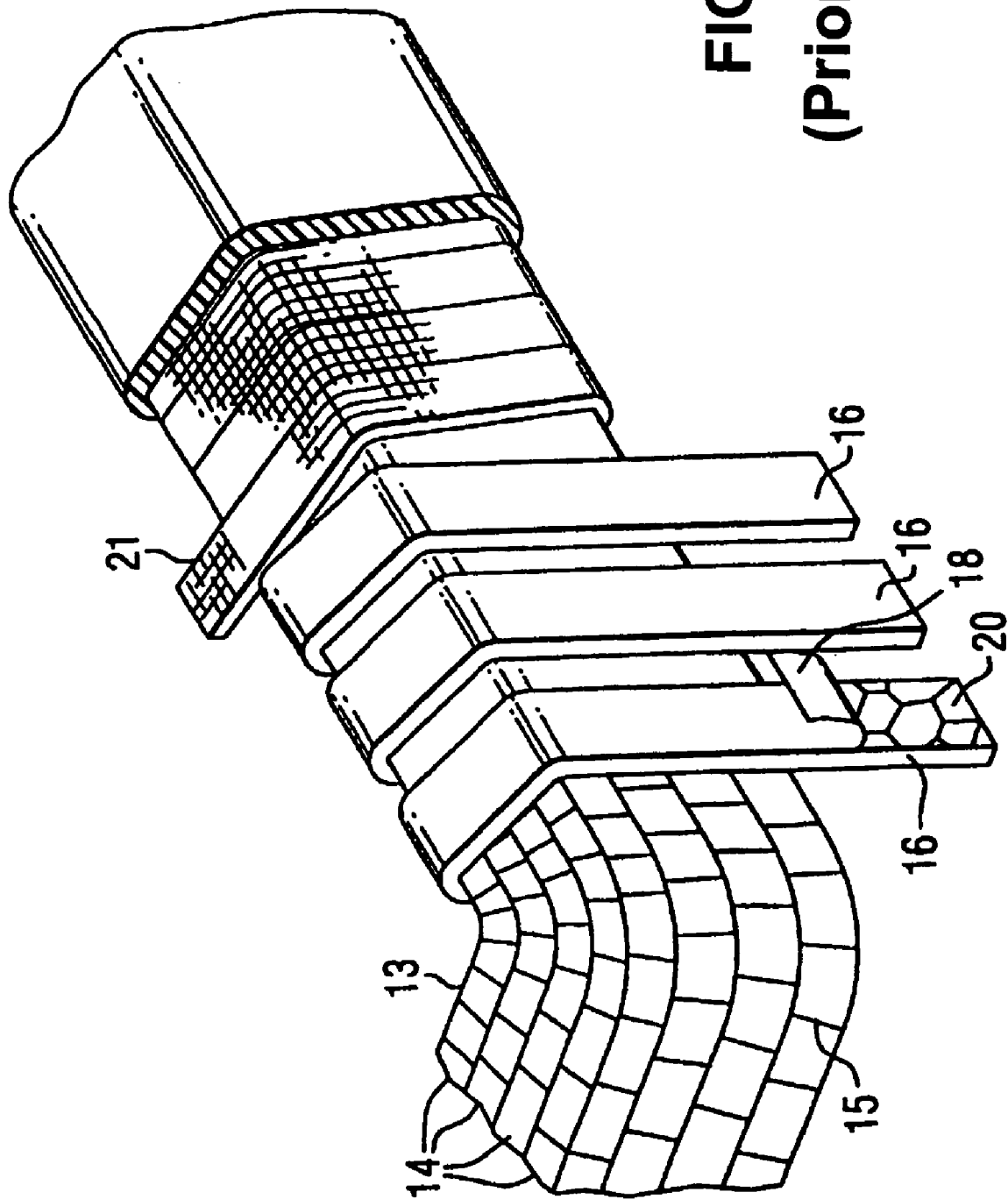
FIG. 1 shows the use of an insulating tape being lapped around a stator coil.
Figure 2:
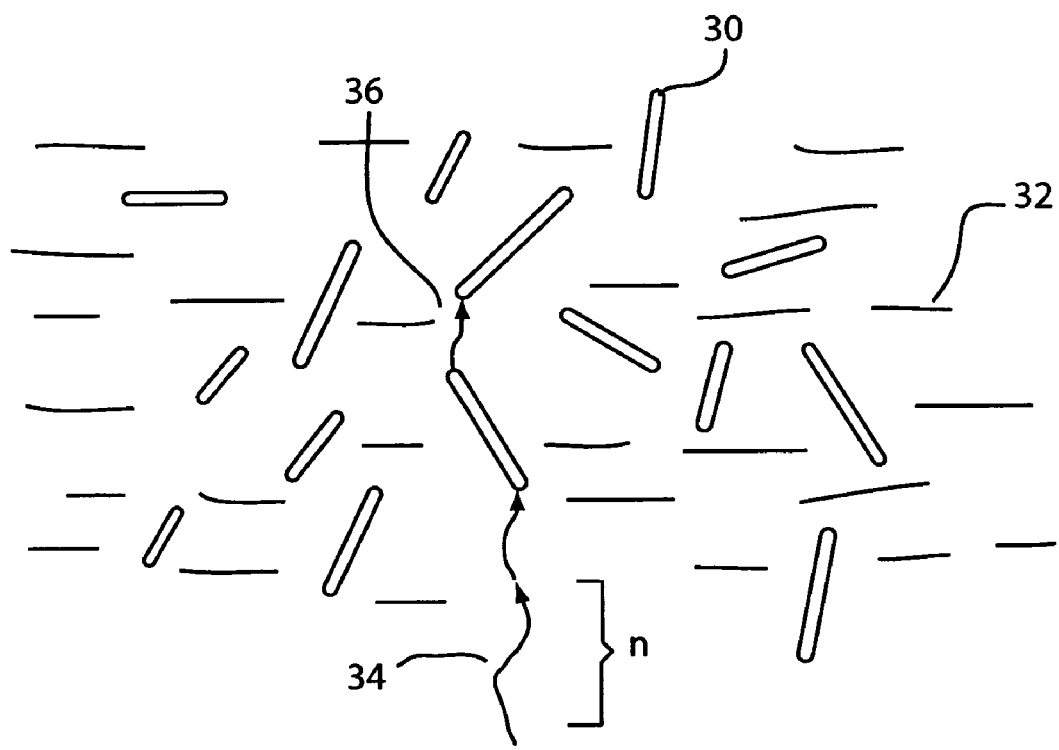
FIG. 2 illustrates phonons traveling through a loaded resin of the present invention.

FIG. 2 illustrates HTC materials 30 without ORSs loaded into a resinous matrix 32. Phonons 34 traveling through the matrix have a mean path length n; this is the phonon mean free path. This path length can vary depending on the exact composition of the resin matrix, but is generally from 2 to 100 nm, and more typically 5-50 nm, for resins such as epoxy resins. Therefore the mean distance between the loaded HTC materials should be on average less than this distance. Note that the distance between the HTC materials can vary in the thickness versus transverse direction of the tape, and it is generally the thickness direction where the spacing needs to be optimalized.

As phonons 34 travel through the resin 32 they will tend to pass along the embedded HTC materials 30. This will increase the local phonon flux since the raw HTC materials will have a thermal conductivity of between 10-1000 W/mK, as opposed to the resin which is about 0.1-0.5 W/mK. As phonons pass along a loaded HTC material the phonons 36 pass to the next HTC material if the distance between the materials is less than n; therefore, the HTC materials form an interconnecting network. FIG. 2 illustrates an idealized path. In practice there will be phonon scattering as the phonons pass between the resin and HTC materials, although the shorter the distance between the materials, and the better the match of phonon propagation characteristics between the HTC materials and the resin, the less the scattering.

The amount of HTC materials loaded in the resin could actually be quite low, for example about 10% as illustrated in FIG. 2. The average distances, or length scales, between loaded HTC materials therefore may be slightly greater than n; however, a large percentage will still be less than n and therefore fall within embodiments of the present invention. In particular embodiment, the percentage materials that are less than n distance from the next HTC material is over 50%, with particular embodiment being over 75%. In particular embodiment the average length of the HTC materials is greater than n, which further aids in phonon transport.

The shorter the n the greater the concentration of loaded HTC materials, and conversely, the greater the particle size, the less HTC materials needed. Particular embodiment use 5-60% loaded HTC materials by total volume of the resins and fillers, with more particular embodiments at 25-40%. When the resin is impregnated into the tape, it will fill up the spaces between the tape fibers and substrates. The HTC distribution within the tape at this point, however, is often not optimized, and can even have the mean distance between HTC materials greater than n. Practice of the present invention then compresses the resin impregnated tapes and reduces the distances between the loaded HTC materials.

Figure 3:
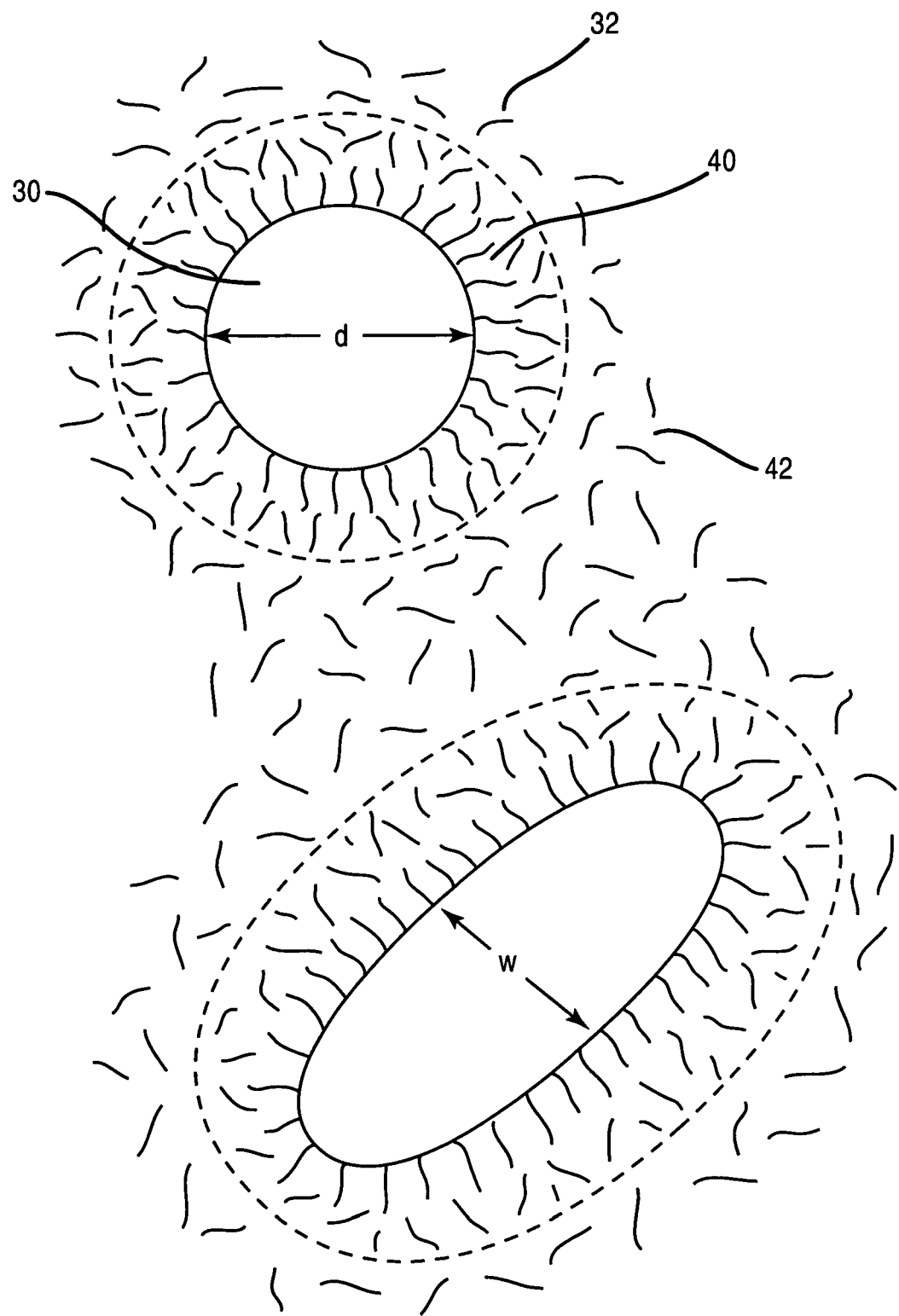
FIG. 3 illustrates examples of resin ordering around differently shaped particles.

In FIG. 3, examples of ORSs are illustrated. The filler particles 30 are surrounded by resin molecules 32. Within a given distance from the surface of the filler, the resin molecules will have a high degree of ordering 40, thereby forming an ORS. The average length of the resin molecules, as well as the amount of mesogenic structures with the resin molecules will also affect ordering. Generally, mesogenic substructures have a positive influence on ordering, while longer non crystallizable resin molecules have a negative influence because they are less ordered and structured. In general, the amount of ordering reduces the further the resin molecules are from the filler, until eventually the amount of ordering becomes negligible 42. An exception to this would be a liquid crystal polymer matrix, or blend, where the degree of ordering at some distance from the filler will always remain finite. For such systems, the filler surfaces can provide nucleation sites.

Figure 4:
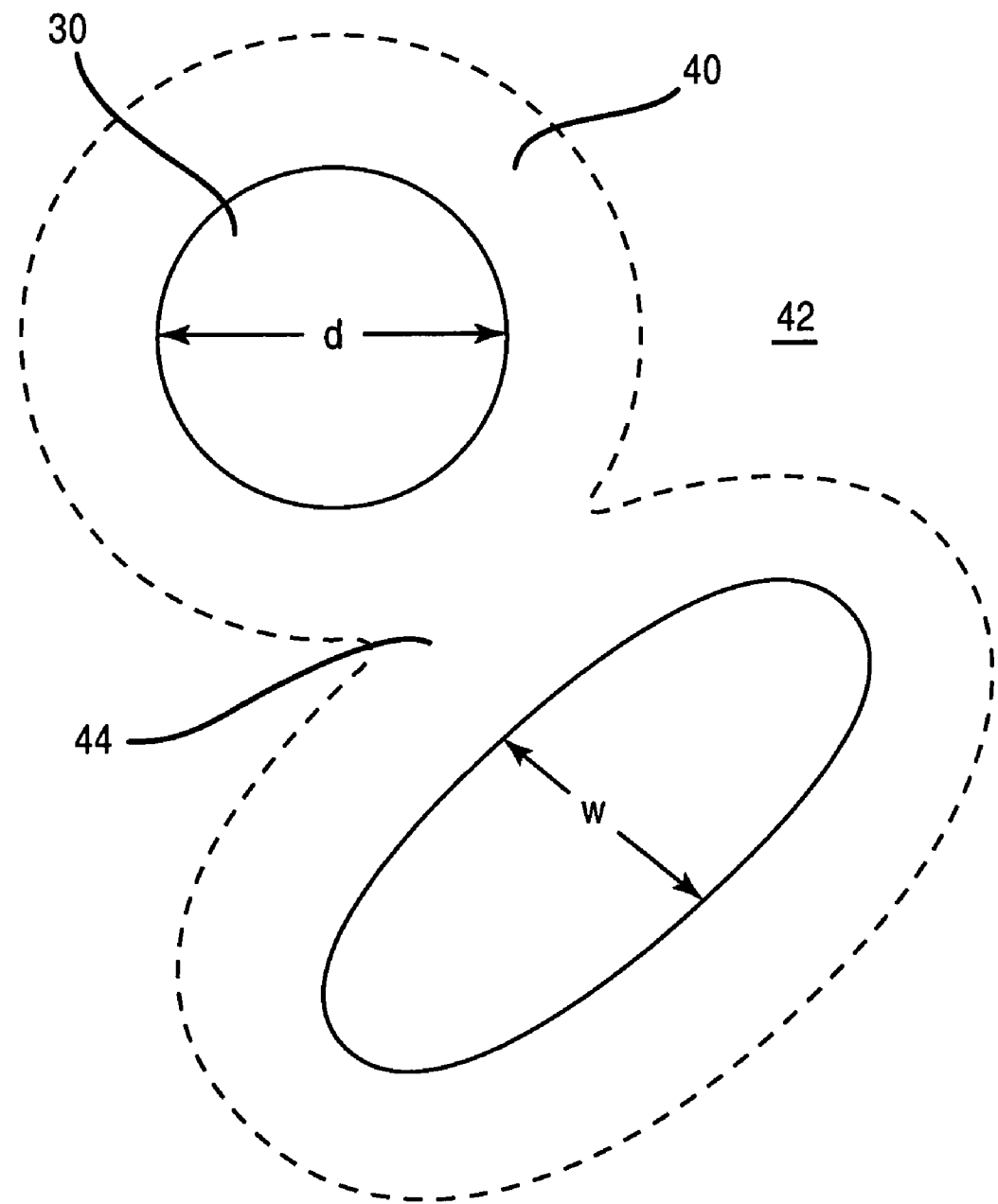
FIG. 4 illustrates an example of overlapping ordered resin shells around filler materials in a resin medium.

Referring to FIG. 4, when particles 30 are spaced closely enough, the ordered regions 40 can overlap with each other 44, thereby forming continuous areas of overlap. The connected shells provide pathways for increased phonon flux, since the scattering of the phonons through the ordered regions is reduced compared to the scattering through the non ordered resin 42. Merging ordered regions can have a positive influence on one another, thereby extending the ORS slightly more as it merges into neighboring ORS The concentration of fillers needed to form a pathway through a resin depends on multiple factors, such as the size of the fillers, surface chemistry and resin composition. Assuming 100% particle wetting in a bisphenol-A or F resin and an average particle diameter/width of 100 nm, the total percentage of filler in the filler/resin composite for physical percolation to occur is typically 35-50% by weight depending on particle morphology. However, in order to assure an ORS overlap throughout, the concentration of the filler particles should be at least 3-5% by weight in dealing with sizes in the 100 nm range. Increasing the concentration will increase the amount of overlapping, although the improvement to phonon transport from this effect will taper off as overlapping becomes widespread.

Smaller HTC filler materials can also be used to connect thermal pathways between larger particles and even aggregated secondary structures formed from multiple smaller particles. The larger particles have high thermal conduction properties, but since they are larger the amount of resin that they influence in relation to the volume that they occupy is less than that of the smaller particles. The larger particles are also often spaced apart at distances greater than n. By interspersing smaller fillers, they can act to bridge the matrix between the larger particles.

Figure 5:
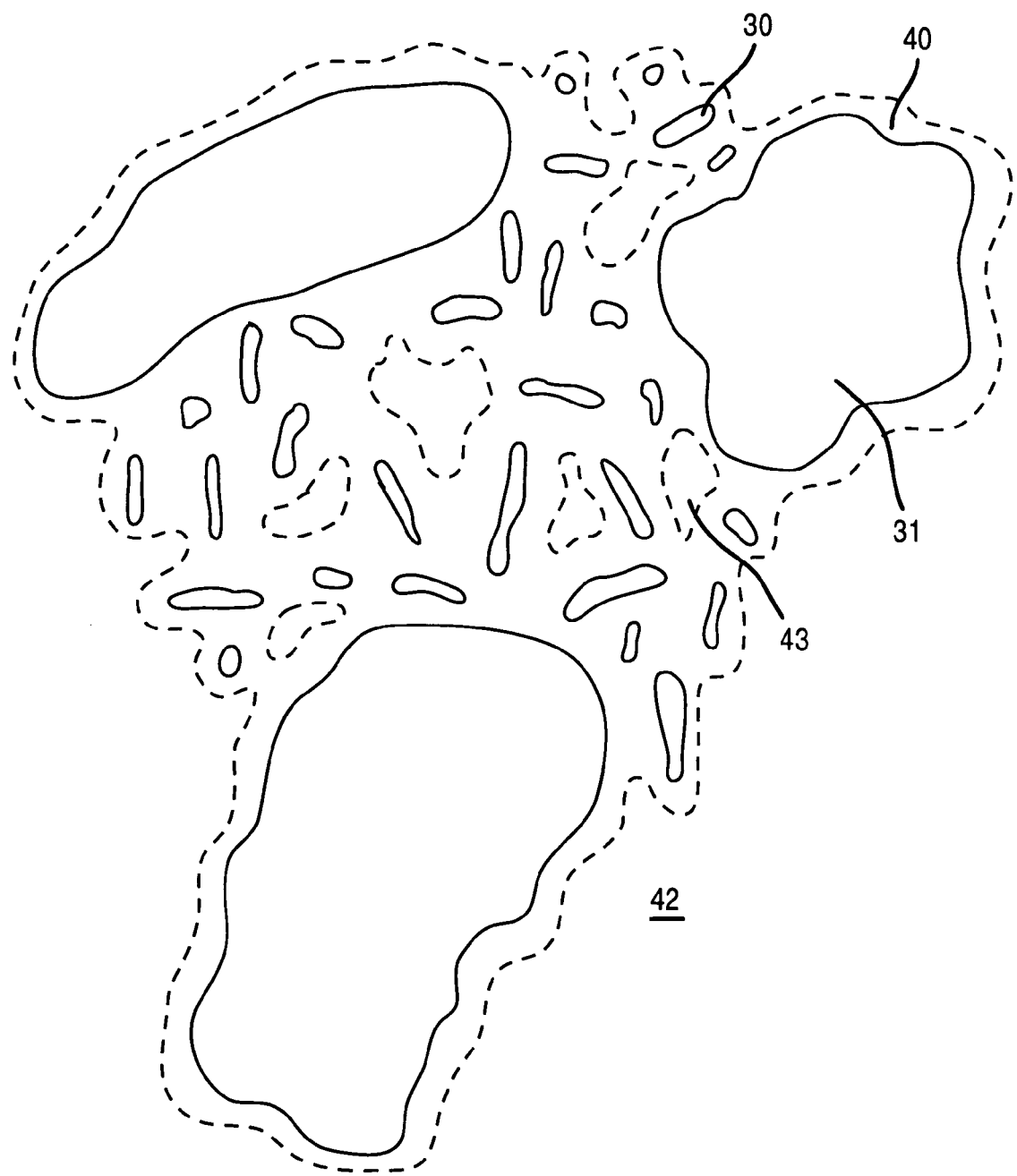
FIG. 5 illustrates larger and smaller particles mixing to form multiple overlapping ordered resin shells.

FIG. 5 illustrates an example of this. The amount of resin that forms the ORS is highly dependant on the surface area of the particle, and smaller particles 30 will tend to create ORS regions at least as large as their own volume. The large particles 31 will tend to create the same surface area influenced ORS 40, but the larger particles will not tend to be close enough with one another to have their ORS overlap, leaving large regions of little or no ordering 42. By mixing smaller particles in with the larger particles, the resin matrix between the larger particles can be ordered, although some gaps in the ordering 43 may still be present.

For the purposes of this invention, smaller particles have size dimensions, such as diameter or width, that are a maximum of 100 nm, and larger particles have at least one size dimension that is greater than 100 nm. More particular ranges have the smaller particles with a length of less than 50 nm, while the larger particles are greater than 500 nm. The ratio of larger particles to smaller particles will be higher, from 3:1 to 10:1 by weight. Generally speaking, the smaller the smaller particles are, the less of them, by weight, are required.

The ORS may be controlled chemically and physically as a series of interfaces around a central core, where the core is the bulk material of the filler particle. The first part of any shell will begin at the surface of the filler particle itself, which may be spatially distributed, and may also contain defect sites and chemical functional groups not present in the bulk of the filler.

The ordered layer of a surrounding organic matrix may interface with the filler by way of a surface treatment of the filler particle such as an ionic or nonionic surfactant or a silane coupling agent or related compound. The surface treatment will be controlled by its molecular weight, conformation and packing behavior to aid in the interaction of the resin molecules with the filler particle's surface. Matrix resins containing linear flexible chains such as the aliphatic silanes, or linear rigid rod molecular structures such as those in bisphenol A and F molecules, or linear molecules having liquid crystalline character as in liquid crystalline epoxies, will have a higher ordering in either radial or normal direction depending on the particle shape. Other examples of resins that will tend to form ordered shells include matrix resins such as polybutadienes, IPN's, ladder polymers and organic-inorganic structures such as ORMOSIL (Organically Modified Silicates) and Silsesquioxane-type monomers. In such linear cases the ORS formed by the resin will extend to a distance defined by the Gaussian statistical chain length (if self assembly does not occur), or extend to the self-assembly ordering distance for linear flexible and rigid rod molecules, or extend to the liquid crystal domain size for the liquid crystalline phase that forms. In cases where the first layer contains a surface chemistry or coating that is able to orient the surrounding matrix, ORS and its spatial extent will be governed by the degree of long range ordering conferred by the surface characteristics.

The ORS can also contain dendrimer or star polymer structures which present second, third or n-generation layers which form spherical shells consisting of radially branched layers. These will form radially structured resin molecules with the possibility of the particle surface containing non-reactive or reactive functional groups for reaction with a host organic matrix.

The structure of the ORS is intimately coupled to the original nano or meso particle and may extend a significant distance into the surrounding resin matrix. Such ordered regions will have lower phonon scattering than equivalent amorphous interfaces and will create an enhancement in the thermal conductivity of the composite. This enhancement will be controlled by the choice of the nano or meso particulate filler and the thermal conductivity of the particle. As well, the enhancement will also be greater for ORSs that have similar phonon transport characteristics to that of the particle as this will further reduce phonon scattering in the composite. This can be achieved through filler addition. Ideally the phonon propagation modulus of the particle will match that of the ordered resin, by choice of resin, or by structural reinforcement of the resin by choice of fillers (creating overlapped shells), and surface treatment of the particle.

On average, lower density is normally paired with disorder. Structural orientation and order gradation versus density gradation can be exceptions based on the resin chosen.

The ORS also may be created to provide enhanced or reduced charge transport for ions or electrons which may be used to control the electrical conductivity around the particle. This can be accomplished by using particular functional groups both in the surface reactants on the particles and in the resin molecules that attract to the particle surface. For example, functional groups such as OH, COON, NH2, SO3H can enhance charge and vinyl, carboxyl, carbonyl functional groups reduce charge.

The ORS may also be created to have a particular relative permittivity difference to that of the particle which will control the interfacial polarization condition which along with the charge behavior will enable control of the dielectric response and relaxation behavior (permittivity and loss) because the ORS structured polymer chains are more rigid and more highly compacted. The ORS may also be manipulated to provide particular charge trapping and mechanical barrier properties which can make the composite material resistant to electrical tree initiation and propagation and so improve the electrical strength and voltage endurance performance of the composite.

The resulting resin composites may be used as bonding resins in mica-glass tape constructions, as unreacted vacuum-pressure impregnation resins for conventional mica tape constructions and as stand alone materials to fulfill electrical insulation applications in rotating and static electrical power plant and in both high and low voltage electrical and electronic equipment, components and products.

In one embodiment the present invention provides for a high thermal conductivity resin that comprises a host resin matrix and high thermal conductivity fillers that are mixed within the host resin to form a resin mixture. The fillers comprise at least 3-5% by weight of the resin mixture, and the fillers are from an average of 1-100 nm in at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture.

In particular embodiments the fillers have been surface treated to increase reactivity with the resin matrix. The surface treatment is chosen from the group consisting of hydroxyl, carboxylic, amine, epoxide, silane and vinyl. The fillers may also form into dendritic stars.

In other particular embodiments, the ordered resin shell comprises a volume approximately equal to or greater than that of the HTC filler, and the ordered resin shell is formed around individual particles. The fillers are comprised of larger particles and smaller particles, the larger particles have at least one size dimension that is greater than 100 nm and the smaller particles have at least one size dimension that is smaller than 100 nm. In particular the ratio of larger particles to smaller particles will be higher, from 3:1 to 10:1 by weight.

In still other embodiments the resin is comprised of at least 50% liquid crystal epoxy resin. The fillers can provide seeding site for the crystallization of the liquid crystal epoxy resin. The particles may also be surface treated to provide enhanced charge transport, and can be the addition of a functional group chosen from the group comprising OH, COOH, NH2 and SO3H.

In various other embodiments, the resin mixture is impregnated into a porous media. The high thermal conductivity fillers have an aspect ratio of between 10-50. And, the high thermal conductivity filler is formed from a two phase organic-inorganic composite.

In another embodiment the present invention provides for a continuous organic-inorganic resin that comprises a host resin network, and inorganic high thermal conductivity fillers evenly dispersed in, and essentially completely co-reacted with, the host resin network. The high thermal conductivity fillers are selected from at least one of oxides, nitrides, and carbides, and have been surface treated to introduce surface functional groups that allows for the essentially complete co-reactivity with the host resin network. The continuous organic-inorganic resin comprises a minimum of 3% and a maximum of 50% by weight of the high thermal conductivity fillers. The high thermal conductivity fillers are from an average of 1-100 nm in at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture.

In particular embodiments, the oxides, nitrides, and carbides comprise Al2O3, AlN, MgO, ZnO, BeO, BN, Si3N4, SiC and SiO2 with mixed stoichiometric and non-stoichiometric combinations. The continuous organic-inorganic resin is impregnated into a porous media, and the porous media is a paper matrix.

In still another embodiment the present invention provides for a porous media impregnated with a high thermal conductivity resin that comprises a porous media, and a high thermal conductivity material loaded resin. The high thermal conductivity material comprises 3-50% by weight of the resin, and is one of silica, alumina, magnesium oxide, silicon carbide, boron nitride, aluminum nitride, zinc oxide and diamonds and dendrimers. The high thermal conductivity fillers are from an average of 1-100 nm in at least one dimension, and where the particles are smaller than an average of 1000 nm in the particles' longest dimension. The host resin matrix forms an ordered resin shell around the high thermal conductivity fillers, whereby resin molecules are aligned perpendicular to the surface of the high thermal conductivity fillers. An overlap of the ordered resin shells is formed between the high thermal conductivity fillers such that continuous pathways for ordered resin shells are created through the resin mixture. An example of a paper matrix is a mica-glass insulating paper or tape.

Referring again to the fillers, two phase organic-inorganic hybrids may be formed by incorporating inorganic micro, meso or nano-particles in linear or cross linked polymers (thermoplastics) and thermosetting resins. Host networks include polymers and other types of resins, definitions of which are given below. In general, the resin that acts as a host network may be any resin that is compatible with the particles and, if required, is able to react with the groups introduced at the surface of the filler. Nano-particle dimensions are typically of the order of or less than the polymer network segmental length. For example 1-30 nm. The inorganic particles contain reactive surfaces to form covalently bonded hybrid organic-inorganic homogeneous materials. The particles may be oxides, nitrides, carbides and hybrid stoichiometric and non-stoichiometric mixes of the oxides, nitrides and carbides, more examples of which are given below.

The inorganic particles are surface treated to introduce a variety of surface functional groups which are capable of participating in reactions with the host network. The surface functional groups include but are not limited to hydroxyl, carboxylic, amine, epoxide, silane and vinyl groups. The groups may be applied using wet chemical methods, non-equilibrium plasma methods, chemical vapor and physical vapor deposition, sputter ion plating and electron and ion beam evaporation methods.

The discrete organic-dendrimer composites may be reacted together or with the resin matrix to form a single material. The surface of the dendrimer can contain reactive groups similar to those mentioned above, which will either allow dendrimer-dendrimer or dendrimer-organic matrix reactions to occur. The dendrimer will have an inorganic core and an organic shell containing the reactive groups of interest. It may also be possible to have an organic core with an inorganic shell which also contains reactive groups such as hydroxyl or silane groupings which can participate in inorganic reactions similar to those involved in common sol-gel chemistries.

In regards to the use of non-discrete organic-inorganic hybrids it is possible to use sol-gel chemistry to form a continuous molecular alloy. Gel sol-chemistries involving aqueous and non-aqueous reactions may be used. Other compounds for the formation of organic-inorganic hybrids include the polyhedral oligomeric silsesquioxanes (POSS), tetraethyl orthosilicate (TEOS) and tetrabutyl orthotitanate (TBOT) and related monomeric and oligomeric hybrid compounds which are organic functionalized inorganic compounds. In the example of POSS, molecules are built around a building block of R—$SiO_{1.5}$ in which the R group is chosen to compatibilize with and/or react with other organic compounds and the host network. The base compounds may be combined to yield larger molecules commensurate with the size of polymer segment and coil structures. POSS may be used to create organic-inorganic hybrids and may be grafted into existing polymers and networks to control properties, including thermal conductivity. The materials may be obtained from suppliers such as Aldrich™ Chemical Co., Hybrid Plastics™ Inc. and Gelest™ Inc.

As mentioned, it is important to control the structural form of the materials to reduce phonon scattering. This can be further assisted by using nano-particles whose matrices are known to exhibit high thermal conductivity and to ensure that the particles size and its interfacial characteristics with the resin are sufficient to sustain this effect, and also to satisfy the length scale requirement to reduce phonon scattering. A choice of structures that are more highly ordered will also benefit this, including reacted dendrimer lattices having both short and longer range periodicity and ladder or ordered network structures that may be formed from a host resin, such as liquid crystal epoxies and polybutadienes.

The filled resins may be used as bonding resins in a variety of industries such as circuit boards and insulating tapes. A particular kind of insulating tape is the mica-glass tape used in the electrical generator fields. Resins with these types of tapes can be used as bonding resins, or as impregnating resins as is known in the art. The filled resin may also be used in the electrical generator field without the tapes to fulfill electrical insulation applications in the rotating and static electrical equipment components.

The tapes may be impregnated with resin before or after being applied to electrical objects. Resin impregnation techniques include VPI and GVPI, discussed more below. In VPI, once a tape is lapped and impregnated it is compressed. Once in position, the resin in the compressed tape is cured, which effectively locks the position of the HTC materials. In some embodiments the resin is cured in a two stage process, as will be apparent to one of ordinary skill in the art. However, optimal compression of the loaded HTC materials favors a completely uncured resin during the compression stage.

When a loaded resin is being impregnated into a tape, the fibers or particles of the tape act to block some of the HTC materials, particularly if the resin is 30% or more filler. However, by compressing the tapes, the reverse happens, and more fillers are trapped within the tape as the HTC materials attach themselves to non-mobile parts of the overall structure. The HTC fillers even get pinned to one another. In the embodiments given, it has been implied that the fillers do not react with the resin matrix, however, in some embodiments the fillers do form covalent bonds with the resin and form more homogeneous matrixes. In a homogenous matrix, the resin molecules that are bound to fillers will be retained better than the unbound resin molecules during compression.

Resins are used in a plurality of industries and have a large number of uses. Different properties of the resins affect not only their uses, but also the quality and efficiency of the products that they are used with. For example, when resins are used in electrical insulation applications, their characteristics of dielectric strength and voltage endurance needs to be high, as does the thermal stability and thermal endurance. However, often contrary to these objectives, resins usually will also have a low thermal conductivity. The present invention balances the various physical properties of resins and the insulation system they are introduced into to produce a system that has a higher thermal conductivity than conventional electrically insulating materials while maintaining adequate, and even enhancing, key physical properties such as dielectric strength, voltage endurance, thermal stability and thermal endurance, mechanical strength and viscoelastic response. Delamination and microvoid formation resulting from stresses caused by thermal and mechanical cycling effects are reduced or eliminated. As used herein, the term resin refers to all resins and epoxy resins, including modified epoxies, polyesters, polyurethanes, polyimides, polyesterimides, polyetherimides, bismaleimides, silicones, polysiloxanes, polybutadienes, cyanate esters, hydrocarbons etc. as well as homogeneous blends of these resins. This definition of resins includes additives such as cross-linking agents, accelerators and other catalysts and processing aids. Certain resins, such as liquid crystal thermosets (LCT) and 1,2 vinyl polybutadiene combine low molecular weights characteristics with good crosslinking properties. The resins can be of an organic matrix, such as hydrocarbons with and without hetero atoms, an inorganic matrix, containing silicate and/or alumino silicate components, and a mixture of an organic and inorganic matrix. Examples of an organic matrix include polymers or reactive thermosetting resins, which if required can react with the reactive groups introduced on inorganic particle surfaces. Cross-linking agents can also be added to the resins to manipulate the structure and segmental length distribution of the final crosslinked network, which can have a positive effect on thermal conductivity. This thermal conductivity enhancement can also be obtained through modifications by other resin additives, such as catalysts, accelerators and other processing aids. Certain resins, such as liquid crystal thermosets (LCT) and 1,2 vinyl polybutadiene combine low molecular weights characteristics with good crosslinking properties. These types of resins tend to conduct heat better because of enhanced micro and macro ordering of their sub-structure which may lead to enhanced conduction of heat as a result of improved phonon transport. The better the phonon transport, the better the heat transfer.

When the high thermal conductivity fillers of the present invention are mixed with resins they form a continuous product, in that there is no interface between the resins and the fillers. In some cases, covalent bonds are formed between the fillers and the resin. However, continuous is somewhat subjective and depends on the scale to which the observer is using. On the macro-scale the product is continuous, but on the nano-scale there can still be distinct phases between the fillers and the resin network. Therefore, when referring high thermal conductivity fillers mixing with the resin, they form a continuous organic-inorganic composite, on the macro-scale, while on the micro-scale the same mixture can be referred to as a hybrid.

As mentioned, filled resin may be used in the electrical generator field without the tapes to fulfill electrical insulation applications in the rotating and static electrical equipment components. The use of high thermal conductivity materials in a generator is multiple. Within the stator coil there are component materials other than the groundwall which must have high thermal conductivity to optimize the design. Likewise other components associated with the coils can be used to maximize heat removal. Improvements to stator design dictate that improvements be made to rotor design so that generator efficiency can be maximized.

Examples of these components and materials to which the high thermal conductivity technology described herein can be applied in a stator include inter-strand insulation, internal corona protection (ICP) systems, outer corona protection (OCP) systems, bottom, center, and top fillers including packing and prestressed driving strips (PSDS—top ripple springs); side fillers, laminates, and side PSDS, coil center separator or sword, coil transposition filler, stator wedge, core insulation, diamond spacers, braces or brackets, end-winding bonding resin and compressible gap fillers, connector insulation, parallel ring insulation and parallel ring support structure. In a rotor examples include cell or slot liner, interturn insulation, turn and ground insulation where integral, end cap insulation, blocking, radial pins and leads and slot top packer or "U".

Figure 6:
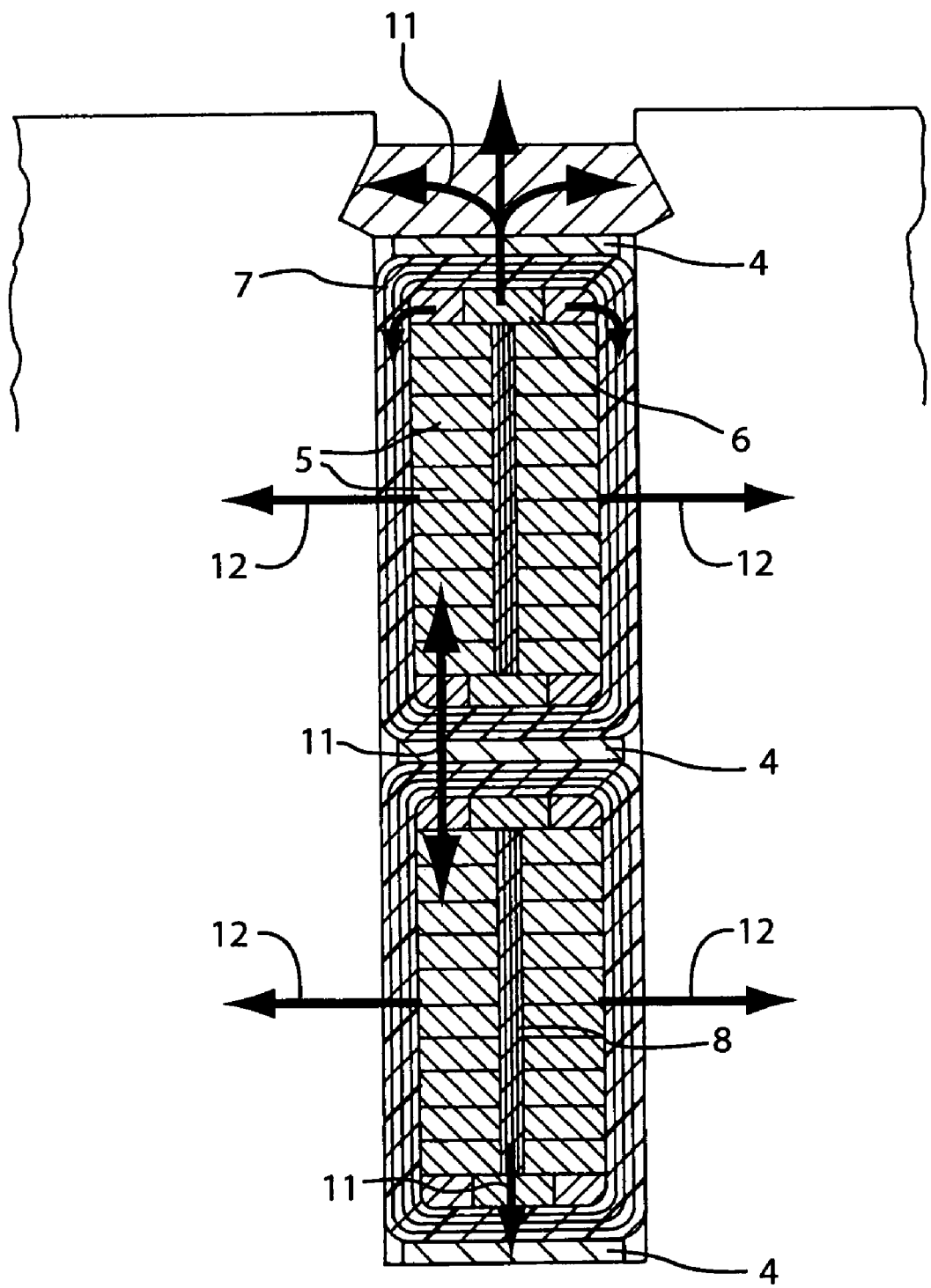
FIG. 6 illustrates heat flow through stator coils.

For clarity, reference is made to FIG. 6, showing a cross sectional view of the main heat flow 12 and the radial additional heat flow 11 through stator coils. The stator coil depicted by this figures includes copper stands 5, transposed strands 6, bottom, center, and top fillers 4, groundwall insulation 7, and center separator 8, among other parts.

The components or materials described above may be produced by a variety of means, including laminating, extrusion, molding, and other processes with which one experienced in the art will be familiar. The construction materials used in a stator coil are copper and insulation. The copper is in the form of strands which are generally insulated, assembled, and converted into a bakelized coil or stack. The bakelized coil is insulated with groundwall insulation, but there are electrical stress control layers associated with it. The major component affecting the thermal conductivity of the stator coil is the groundwall insulation, but other components benefit from being similarly improved. For example, the stress control and other systems employed in the construction of stator coils can typically be from 10 to 20% of the insulation thickness from copper to stator core. In some instances it is proposed to tune the thermal and electrical conductivities to the desired values by introducing structural changes to the materials.

By way of further example, an internal stress control layer may consist of a low conductivity layer, which may be connected to the copper directly or through resistance, or insulated from it. In such instances an insulating layer may be applied to the bakelized coil surface before the low conductivity layer is applied. An insulating tape or sheet may be applied onto the bakelized coil for the purpose of bonding or for smoothing of the surface to fill in void areas. Then an additional layer or layers of material having the required properties may be applied after the low conductivity layer. This may be for electrical purposes such as stress control or insulation.

After the groundwall is applied a low conductivity layer(s) is applied to the surface of the coil to ensure a good connection to the core, to obviate partial discharge and bar bounce effects while avoiding shorting core laminations. An application in which this low conductivity layer has an insulating layer applied over it has also been described in patent literature. The outer corona protection system may therefore include low conductivity, insulating, and part insulating layers.

To control the electrical stress in the stator end region a stress control layer is applied at the ends of the coil straight portion and into the endwindings or involute region. This normally consists of a silicon carbide loaded tape or paint, applied in one or several layers, sometimes stepped layers. It may also be combined with an insulating layer or a relatively high resistivity layer(s). In this application the high thermal conductivity materials will significantly enhance the thermal conductivity of the system. The choice of when to use a high thermal conductivity material will depend on the machine design and the thermal conductivity properties of the normal insulating material and of the groundwall.

In the end region glass tapes and shrink materials are used in certain types of design, for various functions such as consolidation and to enhance mechanical bracing. In addition the mechanical bracing of the endwinding region involves the use of resins, diamond spacers, conformable impregnateable materials such as felts or cloths, and materials into which resin can be loaded such as bags, bladders or hoses. In these components and materials the use of high thermal conductivity materials will significantly enhance the thermal conductivity of the system. The choice of where and when to use a high thermal conductivity material will depend on the machine design and the thermal conductivity properties of the normal insulating material.

In direct cooled rotors the cooling gas or medium is in direct contact with the copper. There are two main designs for direct cooling—radial cooling and axial cooling. The endwinding region may have a different method of cooling. In the radial cooled design the gas passes along a sub-slot or hollow turn at the bottom of each slot. It then passes radially through cooling slots in the solid copper turns and exhausts at the top of the slot. In the axial cooled design the turns are hollow and usually square or rectangular in cross section. Gas enters at each end through holes in the side walls of the hollow conductors and passes along the inside of the copper tubes, exhausting radially through holes in the copper at the rotor center.

In both these designs of rotor the effects of using high thermal conductivity materials on the design is significant. Indeed it may be more significant in indirectly cooled machines. The rotor coils are insulated from ground typically by molded epoxy glass laminates in the form of either slot cells or angles. Interturn insulation may be laminate or angles. It can be appreciated that such components can be made highly thermally conducting by the use of the methods described herein.

One embodiment of the present invention adds high thermal conductivity (HTC) materials to resins to improve the thermal conductivity of the resins. In some embodiments the other physical properties of the resins are reduced in a trade-off with higher thermal conductivity, but in other embodiments, some of the other physical properties will not be significantly affected, and in some particular embodiments these other properties will be improved. In particular embodiments, the HTC materials are added to resins, such as LCT epoxy, that have ordered sub-structures. When added to these types of resins, the amount of HTC material used can be reduced versus use in resins without ordered sub-structures.

The HTC materials loaded into the resins are of a variety of substances that can be added so that they may physically and/or chemically interact with or react with the resins to improve thermal conductivity. In one embodiment, the HTC materials are dendrimers, and in another embodiment they are nano or micro inorganic fillers having a defined size or shape including high aspect ratio particles with aspect ratios (ratio mean lateral dimension to mean longitudinal dimension) of 3 to 100 or more, with a more particular range of 10-50.

As discussed, the fillers can themselves be surface functionalized. Surface treatments on, nano, meso and micro inorganic fillers, introduce a variety of surface functional groups which are capable of compatibilizing the inorganic surface with respect to the organic matrix or to allow chemical reactions to occur with the host organic matrix. These surface functional groups may include hydroxyl, carboxylic, amine, epoxide, silane or vinyl groups which will be available for chemical reaction with the host organic matrix. These functional groups may be applied using wet chemical methods, non-equilibrium plasma methods, chemical vapour and physical vapour deposition, laser beams, sputter ion plating and electron and ion beam evaporation methods.

Examples of exemplary types of resins for impregnation into mica paper can be found in U.S. patent application Ser. No. 11/152,984, "Structured Resin Systems with High Thermal Conductivity Fillers" by Smith et al, which is incorporated herein by reference.

Improvements in epoxy resins have recently been made by using liquid crystal polymers. By mixing an epoxy resin with a liquid crystal monomer or by incorporating a liquid crystalline mesogen into an epoxy resin molecule such as DGEBA, a liquid crystal thermoset (LCT) epoxy resin is produced that contains polymers or monomers that can be cross-linked to form ordered networks having significantly improved mechanical properties. See U.S. Pat. No. 5,904,984, which is incorporated herein by reference. A further benefit of LCTs is that they also have improved thermal conductivity over standard epoxy resins, and lower coefficient of thermal expansion (CTE) values as well.

What makes LCT epoxy resins even more appealing is that they are also better able to conduct heat than a standard epoxy resin. U.S. Pat. No. 6,261,481, which is incorporated herein by reference, teaches that LCT epoxy resins can be produced with a thermal conductivity greater than that of conventional epoxy resins. For example, a standard Bisphenol A epoxy is shown to have thermal conductivity values of 0.18 to 0.24 watts per meter degree Kelvin (W/mK) in both the transverse (plane) and thickness direction. By contrast, an LCT epoxy resin is shown to have a thermal conductivity value, when used in practical applications, of no more than 0.4 W/mK in the transverse direction and up to 0.9 W/mK in the thickness direction.

In addition to the standard mica (Muscovite, Phlogopite) that is typically used for electrical insulation there is also Biotite mica as well as several other Mica-like Alumino-Silicate materials such as Kaolinite, Halloysite, Montmorillonite and Chlorite. Montmorillonite has lattices in its structure which can be readily intercalated with HTC materials such as metal cations, organic compounds and monomers and polymers to give high dielectric strength composites.

Insulating papers are just one type of media that may use the treated mica of the present invention. Many other materials and components made therefrom, in many industries, can use different types of mica. While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which is to be given the full breadth of the claims appended and any and all equivalents thereof.

What is claimed is:

1. A high thermal conductivity resin comprising:
   a host resin matrix; and
   high thermal conductivity fillers, wherein said high thermal conductivity fillers are mixed within said host resin matrix to form a resin mixture;
   wherein said fillers comprise at least 3-5% by weight of said resin mixture;
   wherein said high thermal conductivity fillers are an average of 1-100 nm in at least one dimension and are smaller than an average of 1000 nm in a longest dimension of said fillers;
   wherein said host resin matrix forms ordered resin shells around said high thermal conductivity fillers;
   wherein resin molecules are aligned perpendicular to a surface of said high thermal conductivity fillers;
   wherein an overlap of said ordered resin shells is formed between said high thermal conductivity fillers such that continuous pathways for increased phonon flux are created through said resin mixture; and
   wherein said fillers are comprised of larger particles and smaller particles, wherein said larger particles have at least one size dimension that is greater than 100 nm, and wherein said smaller particles have at least one size dimension that is smaller than 100 nm.

2. The high thermal conductivity resin of claim 1, wherein said fillers comprise surface functional groups for increasing reactivity with the resin matrix.

3. The high thermal conductivity resin of claim 2, wherein the surface functional groups comprise at least one of hydroxyl, carboxylic, amine, epoxide, silane or vinyl.

4. The high thermal conductivity resin of claim 1, wherein said fillers are in the form of dendritic stars.

5. The high thermal conductivity resin of claim 1, wherein the ordered resin shells comprise a volume approximately equal to or greater than that of said fillers, and wherein said ordered resin shells are disposed around individual ones of said fillers.

6. The high thermal conductivity resin of claim 1, wherein the ratio of larger particles to smaller particles is from 3:1 to 10:1 by weight.

7. The high thermal conductivity resin of claim 1, wherein said resin is comprised of at least 50% liquid crystal epoxy resin.

8. The high thermal conductivity resin of claim 7, wherein said fillers are effective to provide a seeding site for crystallization of said liquid crystal epoxy resin.

9. The high thermal conductivity resin of claim 1, wherein said fillers comprise surface functional groups for providing enhanced charge transport for said high thermal conductivity resin.

10. The high thermal conductivity resin of claim 9, wherein said surface functional groups comprise at least one of OH, COOH, NH2, or SO3H.

11. An impregnated porous media comprising the high thermal conductivity resin of claim 1.

12. The high thermal conductivity resin of claim 1, wherein said high thermal conductivity fillers have an aspect ratio of between 10-50.

13. The high thermal conductivity resin of claim 1, wherein said high thermal conductivity fillers are formed from a two phase organic-inorganic composite.

14. A continuous organic-inorganic resin comprising:
   a host resin network; and
   inorganic high thermal conductivity fillers evenly dispersed in said host resin network and essentially completely co-reacted with said host resin network;
   wherein said high thermal conductivity fillers are selected from at least one of oxides, nitrides, and carbides;
   wherein said high thermal conductivity fillers have been surface treated to introduce surface functional groups that allow for the essentially complete co-reactivity with said host resin network;
   wherein said continuous organic-inorganic resin comprises a minimum of 3% and a maximum of 50% by weight of said high thermal conductivity fillers;
   wherein said high thermal conductivity fillers are from an average of 1-100 nm in at least one dimension and are smaller than an average of 1000 nm in a longest dimension;

wherein said host resin network forms ordered resin shells around said high thermal conductivity fillers;

wherein resin molecules are aligned perpendicular to a surface of said high thermal conductivity fillers;

wherein an overlap of said ordered resin shells is formed between said high thermal conductivity fillers such that continuous pathways for increased phonon flux are created through said resin mixture; and wherein said resin is comprised of at least 50% liquid crystal epoxy resin.

15. The continuous organic-inorganic resin of claim 14, wherein said at least one of oxides, nitrides, and carbides comprise Al2O3, AlN, MgO, ZnO, BeO, BN, Si3N4, SiC and SiO2 with mixed stoichiometric and non-stoichiometric combinations.

16. An impregnated porous media comprising the continuous organic-inorganic resin of claim 14.

17. The impregnated porous media of claim 16, wherein said porous media is a paper matrix.

18. A porous media impregnated with a high thermal conductivity resin comprising:

a porous media; and a high thermal conductivity material loaded resin comprising high thermal conductivity fillers dispersed within a host resin matrix, wherein said high thermal conductivity fillers comprise 3-50% by weight of said resin;

wherein said high thermal conductivity fillers comprise at least one of silica, alumina, magnesium oxide, silicon carbide, boron nitride, aluminum nitride, zinc oxide, diamonds and dendrimers;

wherein said high thermal conductivity fillers are from an average of 1-100 nm in at least one dimension and are smaller than an average of 1000 nm in a longest dimension;

wherein said host resin matrix forms ordered resin shells around said high thermal conductivity fillers;

wherein resin molecules are aligned perpendicular to a surface of said high thermal conductivity fillers;

wherein an overlap of said ordered resin shells is formed between said high thermal conductivity fillers such that continuous pathways for increased phonon flux are created through said resin mixture; and wherein said fillers are comprised of larger particles and smaller particles, wherein said larger particles have at least one size dimension that is greater than 100 nm, and wherein said smaller particles have at least one size dimension that is smaller than 100 nm.

19. The porous media impregnated with said high thermal conductivity resin of claim 18, wherein said paper matrix is a mica-glass insulating paper.

* * * * *